United States Patent
Tejnil (10) Patent No.: US 7,326,501 B2
(45) Date of Patent: Feb. 5, 2008

(54) METHOD FOR CORRECTING FOCUS-DEPENDENT LINE SHIFTS IN PRINTING WITH SIDEWALL CHROME ALTERNATING APERTURE MASKS (SCAAM)

(75) Inventor: Edita Tejnil, San Carlos, CA (US)

(73) Assignee: Intel Corporation, Santa Clara, CA (US)

( * ) Notice: Subject to any disclaimer, the term of this patent is extended or adjusted under 35 U.S.C. 154(b) by 697 days.

(21) Appl. No.: 10/386,141

(22) Filed: Mar. 10, 2003

(65) Prior Publication Data

US 2004/0180267 A1    Sep. 16, 2004

(51) Int. Cl.
*G03F 9/00*    (2006.01)
(52) U.S. Cl. ............... 430/4; 430/22; 355/53
(58) Field of Classification Search .............. 430/5, 430/22; 355/53
See application file for complete search history.

(56) References Cited

U.S. PATENT DOCUMENTS

| 5,536,602 | A  | * | 7/1996  | Nakao ............................ 430/5 |
| 6,185,473 | B1 | * | 2/2001  | Pierrat ......................... 700/121 |
| 6,424,882 | B2 | * | 7/2002  | Pierrat ......................... 700/121 |
| 6,942,958 | B2 | * | 9/2005  | Chen et al. .................. 430/311 |
| 7,014,956 | B2 | * | 3/2006  | Chen et al. ...................... 430/5 |
| 7,111,276 | B2 | * | 9/2006  | Kamat et al. ................. 716/19 |
| 7,142,282 | B2 | * | 11/2006 | Borodovsky ................. 355/53 |
| 7,229,722 | B2 | * | 6/2007  | Liebmann et al. ............. 430/5 |

* cited by examiner

*Primary Examiner*—Christopher G. Young
(74) *Attorney, Agent, or Firm*—Fish & Richardson P.C.

(57) ABSTRACT

A lithography system may utilize a biased sidewall chrome alternating aperture mask (SCAAM). Glass steps in the mask may be positioned at the center of the chrome sidewalls in chrome lines rather than the center of the chrome lines themselves.

16 Claims, 8 Drawing Sheets

METHOD FOR CORRECTING FOCUS-DEPENDENT LINE SHIFTS IN PRINTING WITH SIDEWALL CHROME ALTERNATING APERTURE MASKS (SCAAM)

BACKGROUND

A binary photomask may include glass and chrome features which form a pattern. Light may pass through the clear glass areas and be blocked by the opaque chrome areas. Light that passes through the mask may continue through a lens, which projects an image of the mask pattern onto a wafer. The wafer is coated with a photosensitive film (photoresist), which undergoes a chemical reaction when exposed to light. After exposure, the areas on the photoresist exposed to the light may be removed in a developing process, leaving the unexposed areas as features on the wafer.

The quality of an image produced with a binary mask may be degraded by light from clear areas on the mask diffracting into regions that ideally would be completely dark. A nominally dark region may have light diffracted into it from the adjacent nominally bright regions. Consequently, contrast between bright and dark regions on the imaging plane may be degraded, thereby degrading image quality.

DETAILED DESCRIPTION

Figure 1:
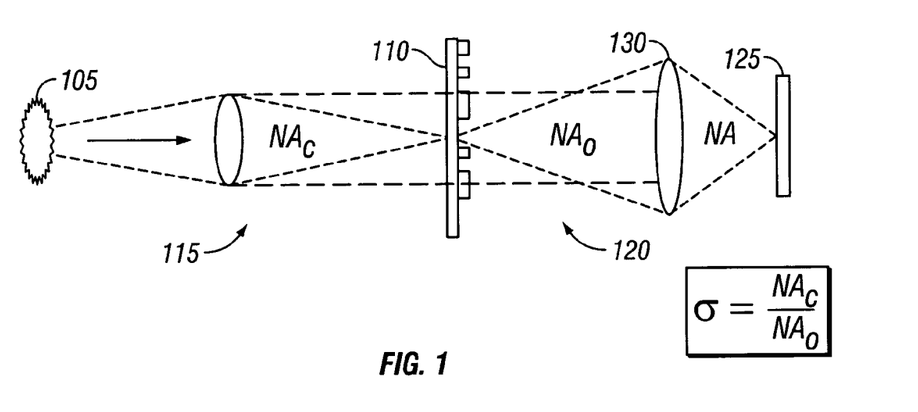
FIG. 1 is a block diagram of an optical lithography system.

FIG. 1 shows an optical lithography system 100. Light from an illumination source 105 is transferred to a patterned mask 110, or reticle, by an illumination system 115. Light passes through the mask and into the entrance pupil of an imaging system 120. The resulting pattern is imaged onto a photoresist covered wafer 125 by a lens 130 in the imaging system.

Figure 2:
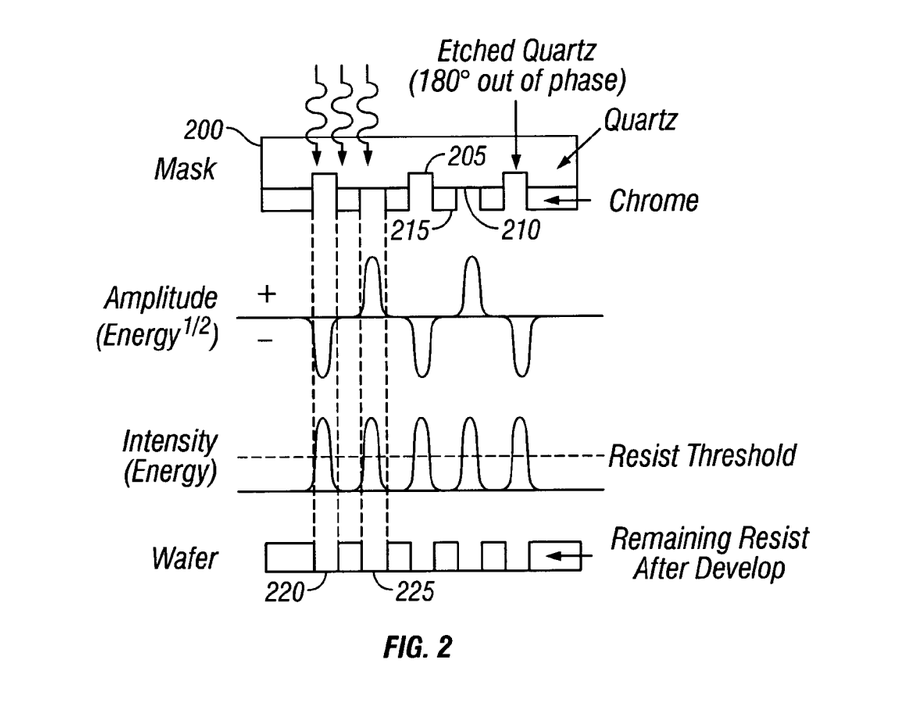
FIG. 2 is a block diagram showing the effect of an alternating phase shift mask (alt-PSM) on the amplitude and intensity of light passing through the mask.

The mask may be a biased sidewall chrome alternating aperture mask (SCAAM). A SCAAM is a type of alternating phase shift mask (alt-PSM). The quality of an imaged mask pattern produced with a typical binary mask may be degraded by light from clear areas on the mask diffracting into regions that ideally would be completely dark. The nominally dark region may have light diffracted into it from the adjacent nominally bright regions. FIG. 2 shows an exemplary alt-PSM 200. In the alt-PSM, alternating clear regions 205 and 210 may have different step heights which cause the light to be phase-shifted 180°. As a consequence, the light diffracted into the nominally dark area 215 from the clear area 205 to the left will interfere destructively with the light diffracted from the right clear area 210. This may improve image contrast on the wafer.

Figure 3A:
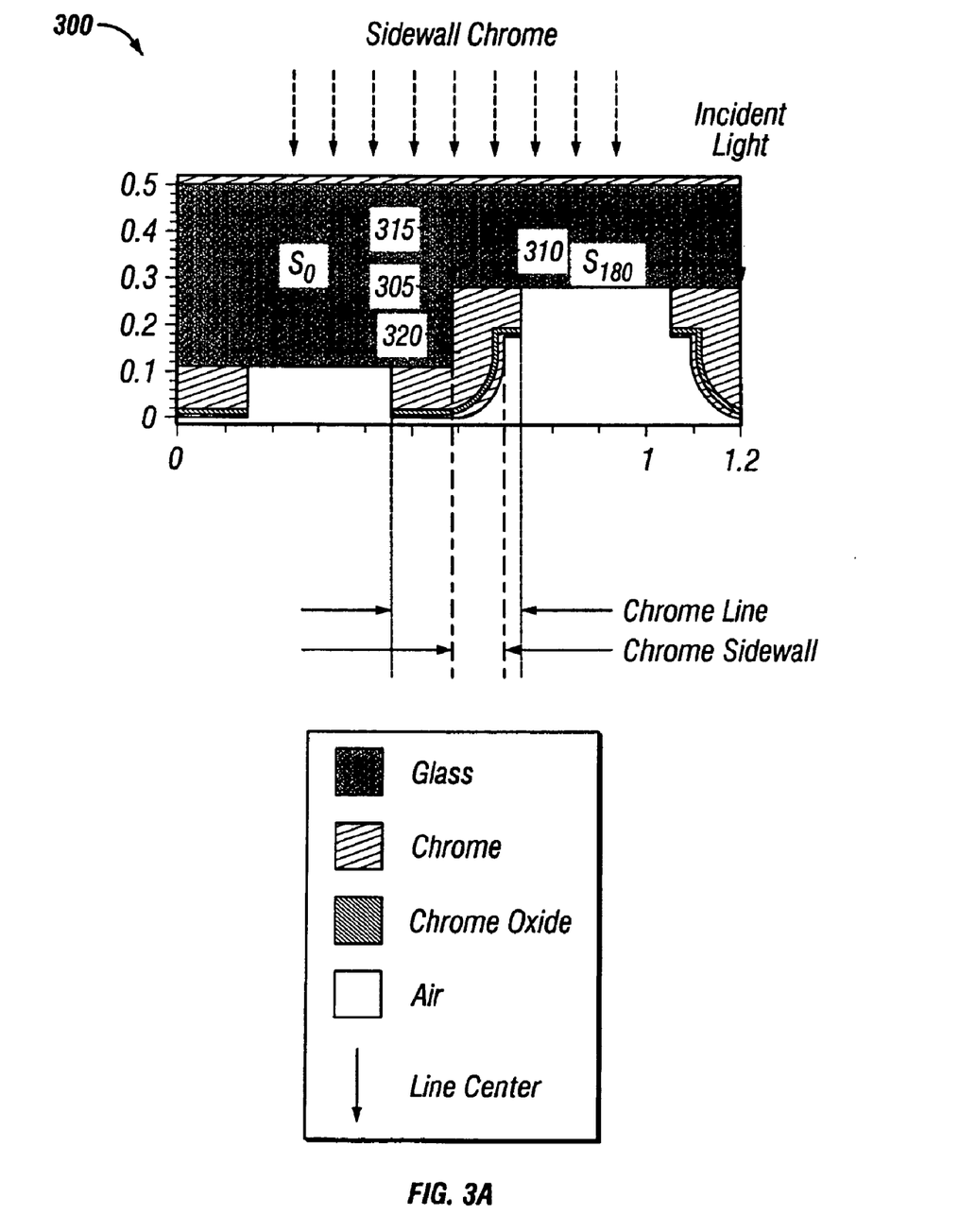
FIG. 3A is a cross sectional view through a line and space pattern on a sidewall chrome alternating aperture mask (SCAAM).
Figure 3B:
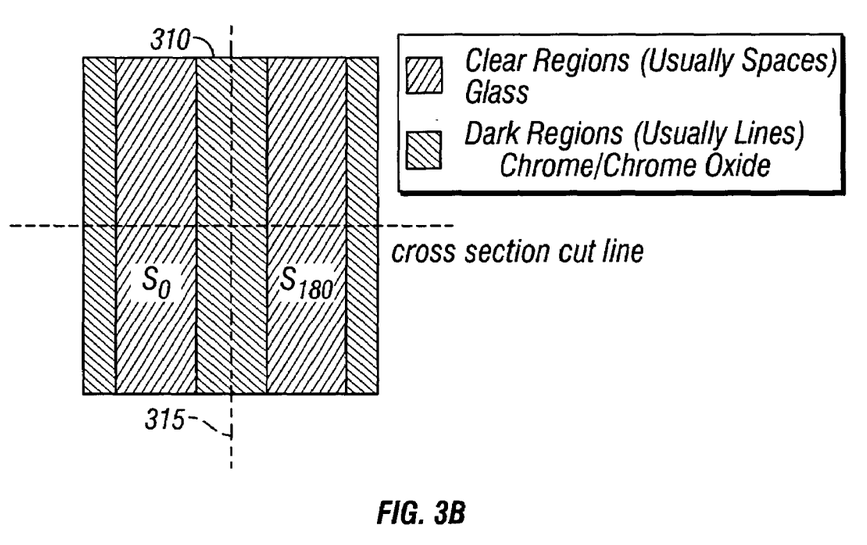
FIG. 3B is a top view of the SCAAM shown in FIG. 3A.

A SCAAM may be manufactured by taking a chromeless mask with an appropriate phase pattern, re-coating the mask with chrome and resist, and generating the desired exposure pattern in the chrome layer. The result is a PSM structure 300 where all glass walls 305 are covered by opaque chrome 310 and all chrome is supported by glass, as shown in FIGS. 3A and 3B. With all glass sidewalls covered and all chrome supported, the SCAAM may minimize phase and amplitude anomalies which may be associated with other PSM structures.

In the SCAAM structure 300 shown in FIGS. 3A and 3B, the glass step 305 may be positioned in the center 315 of the chrome line 310 of the mask. It has been found that, in this arrangement, the mask structure may result in sizeable focus-dependent changes in the difference between spaces 225, 220 on the wafer printed with 0° and 180° phase apertures at tight pitches (see FIG. 2).

Figure 4:
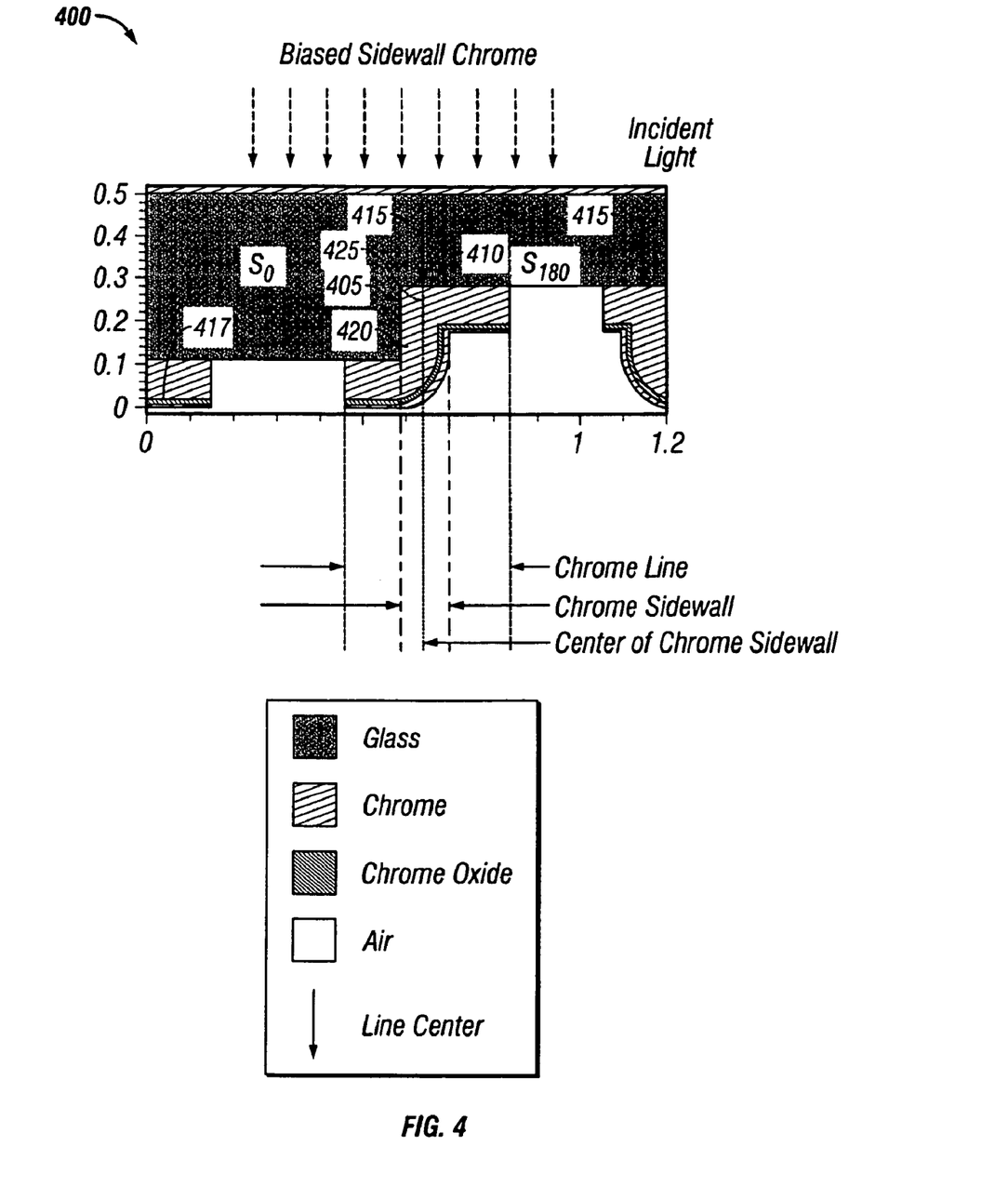
FIG. 4 is a cross sectional view through a line and space pattern on a biased SCAAM.

In an embodiment shown in FIG. 4, the position of a glass step 405 under a chrome line 410 may be adjusted so that the center 425 of a chrome sidewall 420 is positioned at the center 415 of the chrome line 410 (including chrome oxide anti-reflective layer 417). It has been found that, in this arrangement, the focus-dependent changes in the wafer image may be much reduced compared to the structure 300 of FIGS. 3A and 3B, in which the glass step 305 is positioned in the center 315 of the chrome line 310. Improvements in performance are demonstrated by the graphs shown in FIGS. 5-8.

Figure 5A:
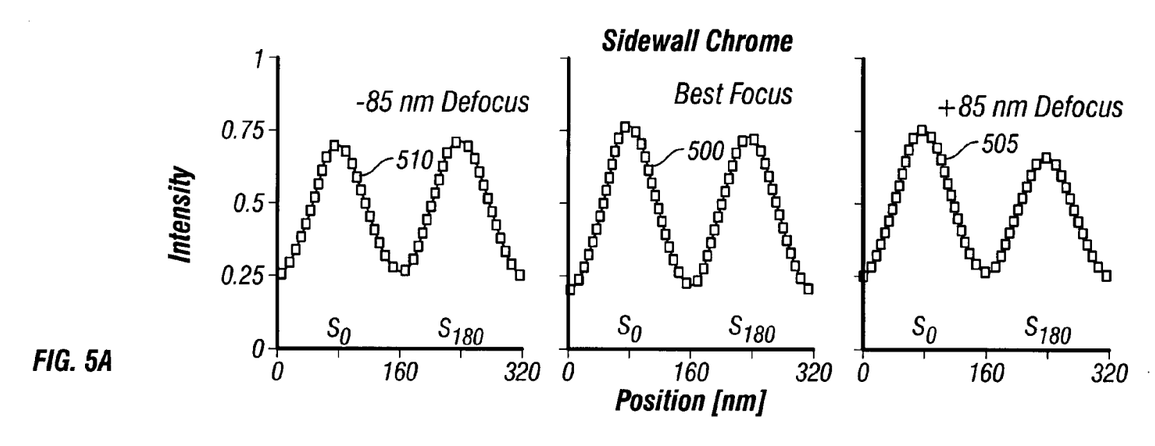
FIGS. 5A and 5B are graphs showing intensity of light at the wafer between shifted and unshifted space regions produced by adjacent 0° and 180° apertures in the SCAAM and biased SCAAM.
Figure 5B:
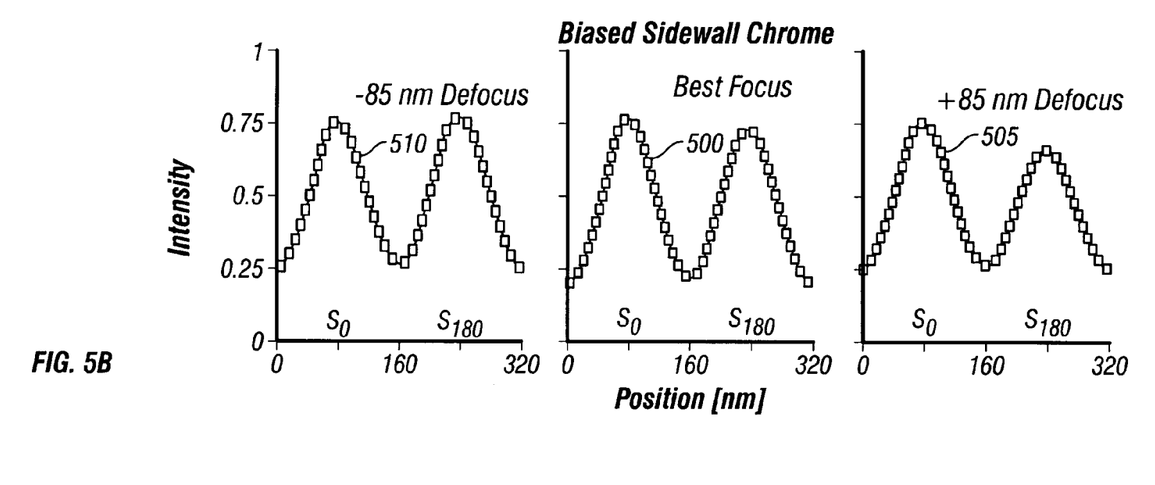
Figure 6A:
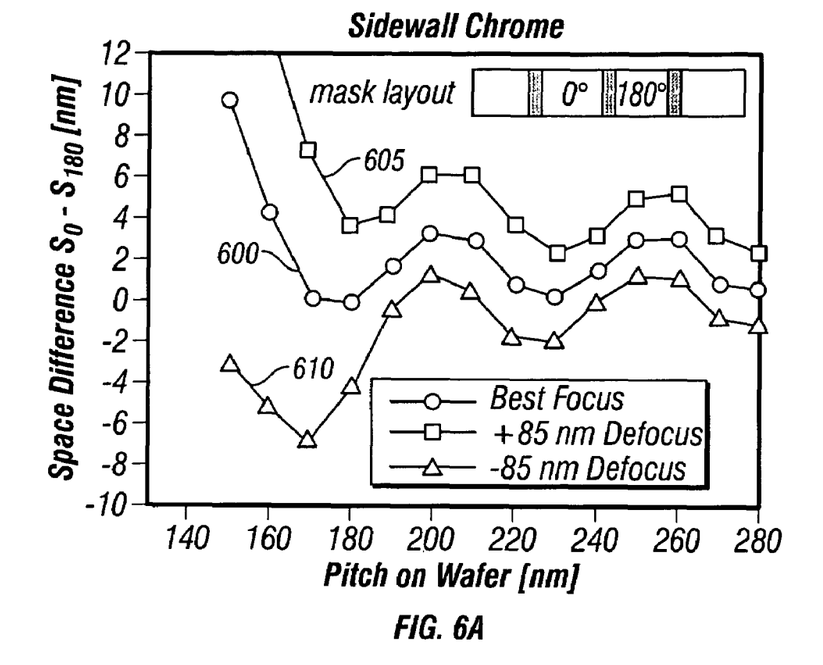
FIGS. 6A and 6B are graphs showing differences in size between shifted and unshifted space regions over a range of pitches in the SCAAM and biased SCAAM.
Figure 6B:
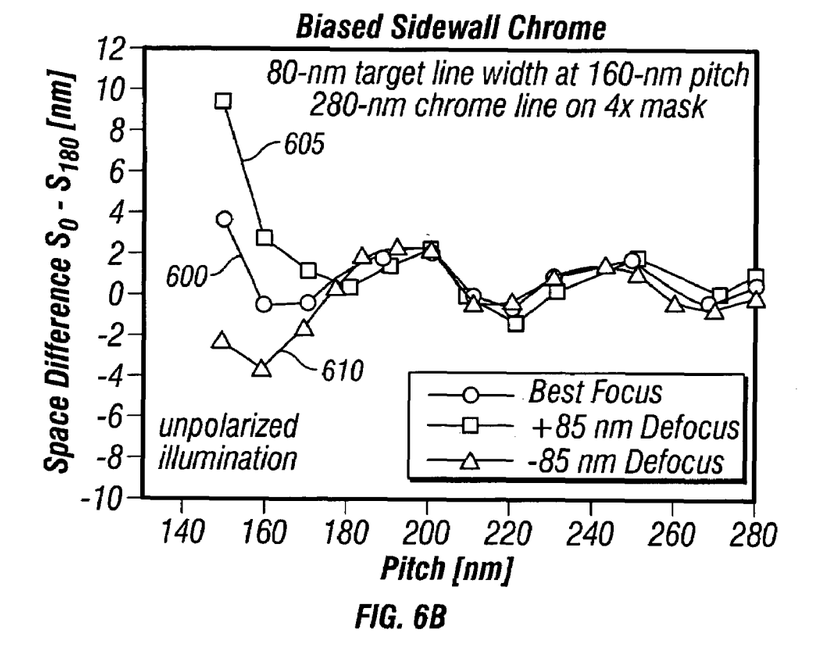

FIGS. 5 and 6 show graphs describing the performance of simulated SCAAM and biased SCAAM masks. Both masks were modeled as 4×reduction masks designed for 193 nm exposure wavelength and imaged with a numerical aperture (NA) of 0.85 and a partial coherence factor ($\sigma$) of 0.4. The width of a chrome line on the masks was 280 nm (4×) and the pitch of the printed images is 160 nm on the wafer (1×).

FIGS. 5A and 5B show the intensity of light at the wafer between shifted ($S_{180}$) and unshifted ($S_0$) space regions produced by adjacent 0° and 180° apertures in the SCAAM and biased SCAAM, respectively. The biased SCAAM produces a higher intensity in the space regions at best focus 500 and lower space size imbalance $S_0$-$S_{180}$ at +85 nm 505 and −85 nm 510 defocus.

FIGS. 6A and 6B show the difference in size between shifted and unshifted space regions over a range of pitches. The biased SCAAM shows lower space size imbalance $S_0$-$S_{180}$ between best focus 600 and +85 nm 605 and −85 nm 610 defocus at 160 nm pitch.

Figure 7A:
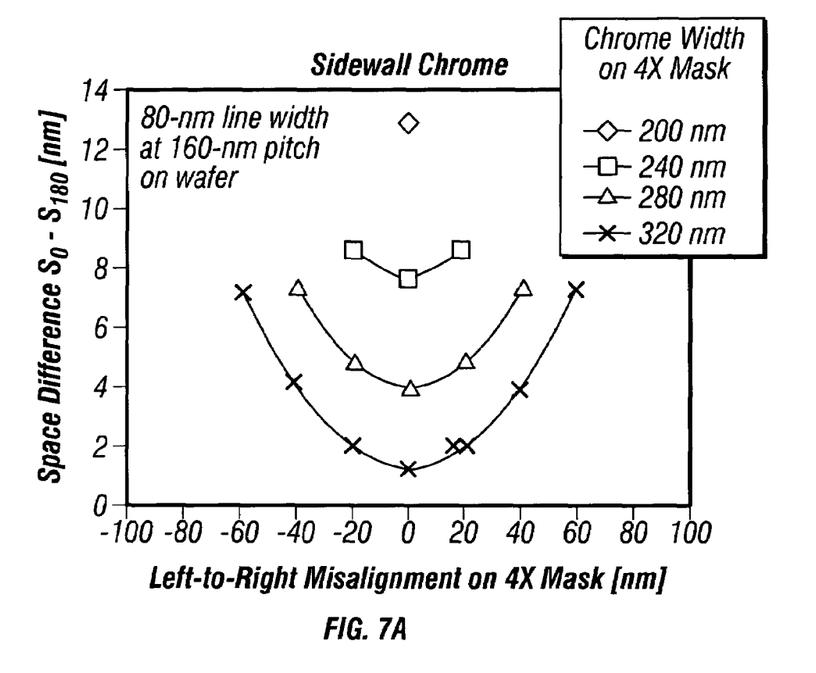
FIGS. 7A and 7B are graphs showing the sensitivity of the difference in the shifted and unshifted spaces to misalignment of the chrome line with respect to the phase region etched in the glass in the SCAAM and biased SCAAM.
Figure 7B:
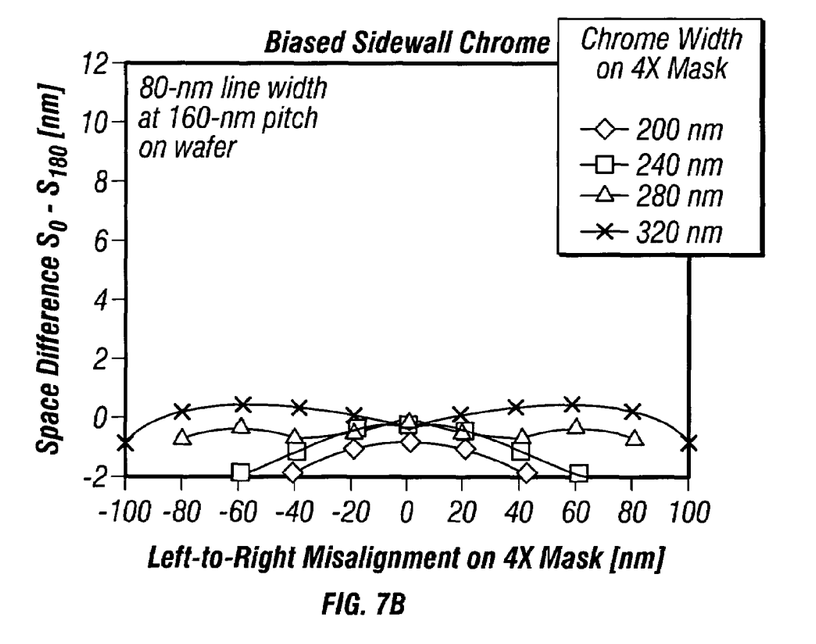

The biased SCAAM structure 400 (FIG. 4) may be less sensitive than the SCAAM structure 300 (FIG. 3) to chrome-to-glass etch pattern overlay errors encountered during mask production. FIGS. 7A and 7B show the sensitivity of the difference in the shifted and unshifted spaces to misalignment of the chrome line with respect to the phase region etched in the glass on the SCAAM and the biased SCAAM, respectively. Both masks were designed for 193 nm exposure wavelength and imaged with a numerical aperture (NA)

of 0.85 and a partial coherence factor (σ) of 0.3. The lines and spaces were printed at a pitch of 160 (1×) and at best focus. The exposure dose was chosen to produce approximately equal lines and spaces on the wafer at 160-nm pitch. The space difference $S_0$-$S_{180}$ is given for several choices of the chrome line width on the mask. For most cases, the difference in spaces for the biased SCAAM varies less over different degrees of misalignment than for the SCAAM.

Figure 8:
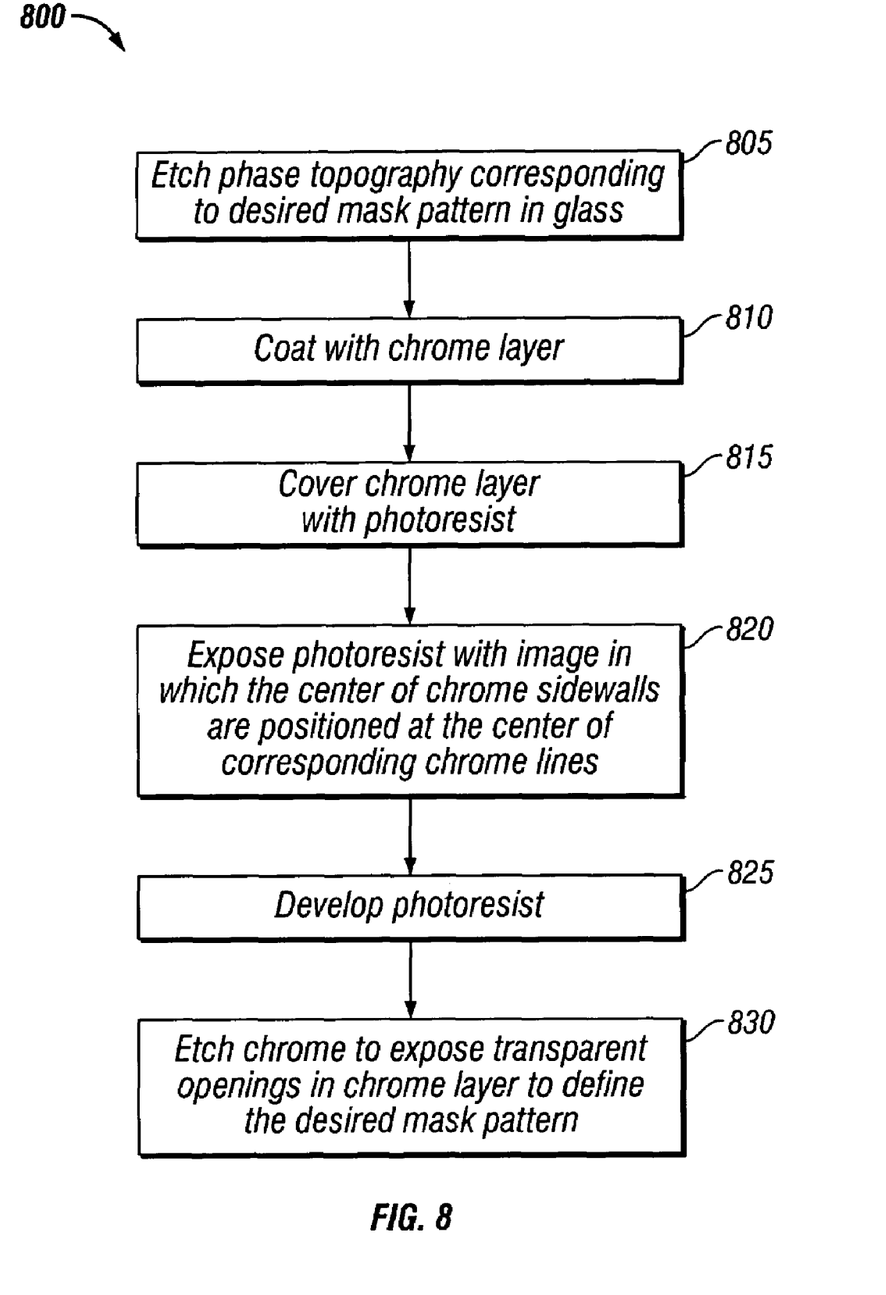
FIG. 8 is a flowchart describing a process flow for fabricating a biased SCAAM.

FIG. 8 shows a process flow 800 for making a biased SCAAM. The phase topography for a mask pattern may be etched in a glass substrate or layer (block 805). The design data for the biased SCAAM may be adjusted, or biased, from that of a typical SCAAM in that the size of the etched glass regions may be made larger in each linear direction such that the center of the chrome sidewalls are positioned at the center of corresponding chrome lines. The exact value of the suitable bias may depend on the actual process and materials used to fabricate the mask. The glass may then be coated with a layer of chrome (block 810). The chrome may be covered with a resist (block 815), which is exposed with the desired mask pattern (block 820). The exposed resist may be developed (block 825) and etched to expose transparent openings in the chrome layer to define the desired mask pattern (block 830).

A number of embodiments have been described. Nevertheless, it will be understood that various modifications may be made without departing from the spirit and scope of the invention. For example, blocks in the flowchart may be skipped or performed out of order and still produce desirable results. Accordingly, other embodiments are within the scope of the following claims.

The invention claimed is:

1. A mask comprising:
a substantially transparent material having a surface including a phase shifted region and an unshifted region;
a step separating the phase shifted region from the unshifted region, the step having a surface; and
a line region comprising a layer of a substantially opaque material covering at least a portion of the phase shifted region and at least a portion of the unshifted region and including a sidewall covering said step surface, the sidewall having a center approximately aligned with a center of the line region, the center of the line region determined with respect to a first line region side on a first side of the step and a second line region side on a second side of the step.

2. The mask of claim 1, wherein the center of the sidewall and the center of the line region are substantially parallel to the step surface.

3. The mask of claim 1, wherein the substantially transparent material comprises a glass.

4. The mask of claim 1, wherein the substantially opaque material comprises chrome.

5. The mask of claim 1, wherein the surface of the substantially transparent material comprises a phase topology including a plurality of phase shifted regions and a plurality of unshifted regions.

6. The mask of claim 5, further comprising a plurality of line regions separating adjacent phase shifted regions and unshifted regions, each line region including a sidewall having a center approximately aligned with the center of said line region.

7. A sidewall chrome alternating aperture mask (SCAAM) comprising:
a plurality of chrome lines, each line extending in a first direction and having a line width perpendicular to the first direction, each line including
a center, the center of the line region determined with respect to the line width, and
a chrome sidewall having a center approximately aligned with the center of said line.

8. The sidewall chrome alternating aperture mask of claim 7, wherein chrome lines in said plurality of chrome lines separate adjacent phase shifted regions and unshifted regions, the chrome sidewalls covering step surfaces separating said adjacent phase shifted regions and unshifted regions.

9. A method comprising:
etching a surface of a substantially transparent material to have a phase topography including a phase shifted region and an unshifted region, the phase shifted region and unshifted region being separated by a step;
coating said surface with a layer of a substantially opaque material, said coating producing a sidewall on the step; and
etching said layer to form a line region separating the phase shift region and unshifted region such that a center of the sidewall is substantially aligned with a center of the line region, the center of the line region determined with respect to a first line region side on a first side of the step and a second line region side on a second side of the step.

10. The method of claim 9, wherein said etching the surface comprises etching a well including the phase shifted region, and further comprising:
determining a size of said well for a thickness of the layer of substantially opaque material such that the center of the sidewall is substantially aligned with the center of the line region.

11. The method of claim 9, wherein said etching the surface comprises etching a glass substrate.

12. The method of claim 9, wherein said coating comprises coating the surface with a layer comprising chrome.

13. A system comprising:
a source operative to generate light;
an imaging plane; and
an optical path operative to direct at least a portion of the light to the imaging plane, the optical path including a mask comprising
a substantially transparent material having a surface including a phase shifted region and an unshifted region,
a step separating the phase shifted region and the unshifted region, the step having a surface, and
a line region comprising a layer of a substantially opaque material covering at least a portion of the phase shifted region and at least a portion of the unshifted region and including a sidewall covering said step surface, the sidewall having a center approximately aligned with a center of the line region, the center of the line region determined with respect to a first line region side on a first side of the step and a second line region side on a second side of the step.

14. The system of claim 13, wherein the mask comprises a biased sidewall chrome alternating aperture mask (SCAAM).

15. The system of claim 13, wherein the substantially transparent material comprises glass.

16. The system of claim 13, wherein the substantially opaque material comprises chrome.

* * * * *